United States Patent [19]

Ditlow et al.

[11] Patent Number: 5,311,079
[45] Date of Patent: May 10, 1994

[54] LOW POWER, HIGH PERFORMANCE PLA

[76] Inventors: Gary S. Ditlow, 53 Moog Rd., Garrison, N.Y. 10524; Steven F. Oakland, 7 Norway Dr., Colchester, Vt. 05446; Dac C. Pham, 17855 Park Valley Dr., Round Rock, Tex. 78681; Kenneth J. Shaw, 33 Aspen Dr., Essex Junction, Vt. 05452

[21] Appl. No.: 992,216

[22] Filed: Dec. 17, 1992

[51] Int. Cl.$^5$ ........................................... H03K 19/177
[52] U.S. Cl. .................................... 307/465; 307/443; 307/449; 364/491
[58] Field of Search ........ 307/443, 449, 465, 468–469; 364/491, 216

[56] References Cited

U.S. PATENT DOCUMENTS

| | | | |
|---|---|---|---|
| 4,233,667 | 11/1980 | Devine et al. | 364/716 X |
| 4,831,285 | 5/1989 | Gaiser | 307/465 |
| 4,957,601 | 12/1990 | Steele | 307/465 |
| 5,053,648 | 10/1991 | van den Elshout et al. | 307/469 |
| 5,250,859 | 10/1993 | Kaplinsky | 307/465 |

Primary Examiner—David R. Hudspeth
Attorney, Agent, or Firm—J. Dennis Moore

[57] ABSTRACT

A programmable logic array (PLA) is provided with a decoder at the input. Each product term line of the PLA has an associated power switch that is controlled by an output of the decoder. Only a portion of the PLA that includes the product term lines activated for a particular operation is powered up for that operation, thus minimizing power consumption.

4 Claims, 4 Drawing Sheets

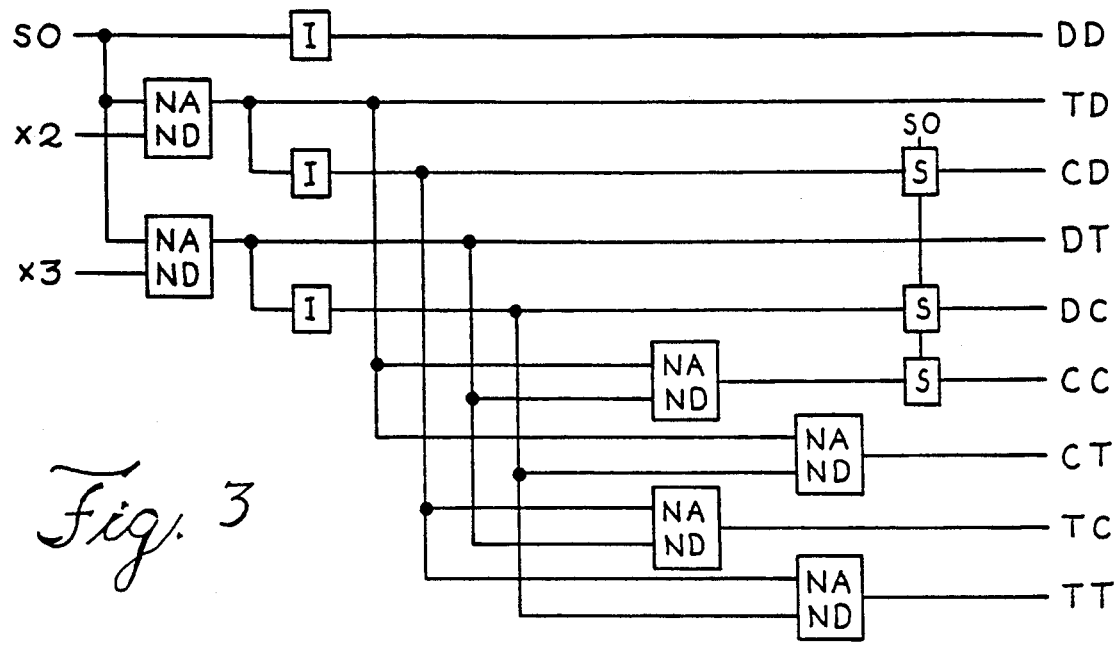
Fig. 3
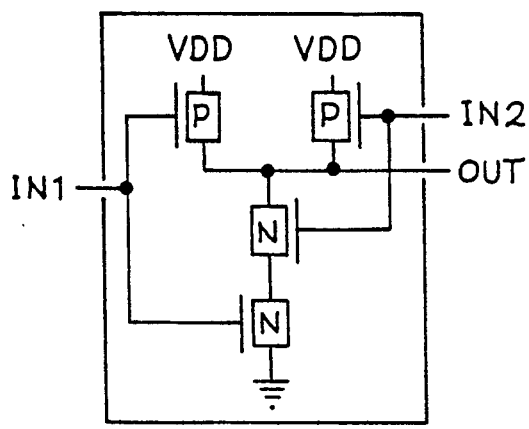
Fig. 4
Fig. 5
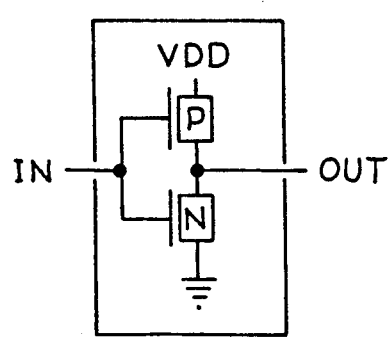
Fig. 6

| X2 | X3 | SELECT |
|---|---|---|
| 0 | 0 | C C |
| 0 | 1 | C T |
| 1 | 0 | T C |
| 1 | 1 | T T |
| 0 | – | C D |
| 1 | – | T D |
| – | 0 | D C |
| – | 1 | D T |
| – | – | D D |

*Fig. 7*

| X2 | X3 | SO | DD | TD | CD | DT | DC | CC | CT | TC | TT |
|---|---|---|---|---|---|---|---|---|---|---|---|
| 0 | 0 | 1 | 0 | 1 | 0 | 1 | 0 | 0 | 1 | 1 | 1 |
| 0 | 1 | 1 | 0 | 1 | 0 | 0 | 1 | 1 | 0 | 1 | 1 |
| 1 | 0 | 1 | 0 | 0 | 1 | 1 | 0 | 1 | 1 | 0 | 1 |
| 1 | 1 | 1 | 0 | 0 | 1 | 0 | 1 | 1 | 1 | 1 | 0 |
| – | – | 0 | 1 | 1 | 1 | 1 | 1 | 1 | 1 | 1 | 1 |

*Fig. 8*

|  | X1 | X2 | X3 | Y1 | Y2 |
|---|---|---|---|---|---|
| PT 1 | – | 1 | 1 | 1 | 1 |
| PT 2 | 0 | 1 | 0 | 1 | 0 |
| PT 3 | – | 0 | 1 | 0 | 1 |
| PT 4 | 0 | 0 | 0 | 0 | 1 |

*Fig. 9*

|  | X1 | X2 | X3 | Y1 | Y2 | AND | OR | AND & OR |
|---|---|---|---|---|---|---|---|---|
| PT 1 | 0 | 1 | 1 | 1 | 1 | 0 | 2 | 2 |
| PT 1 | 1 | 1 | 1 | 1 | 1 | 0 | 2 | 2 |
| PT 2 | 0 | 1 | 0 | 1 | 0 | 0 | 1 | 1 |
| PT 3 | 0 | 0 | 1 | 0 | 1 | 0 | 1 | 1 |
| PT 3 | 1 | 0 | 1 | 0 | 1 | 0 | 1 | 1 |
| PT 4 | 0 | 0 | 0 | 0 | 1 | 0 | 1 | 1 |

*Fig. 10*

LOW POWER, HIGH PERFORMANCE PLA

BACKGROUND OF THE INVENTION

1. Field of the Invention

The present invention relates the field of programmable logic arrays (PLAs), and more particularly relates to high performance PLAs utilized in applications requiring a minimal power consumption.

2. Background Art

PLAs have been used for decades to efficiently implement logic in circuit design. PLAs are widely used, for example, in integrated circuits making up the component parts of computers, including personal computers.

Recently, the market place for personal computers has been demanding ever smaller and more portable personal computers. Such portable computers are typically powered by batteries. This has been feasible using CMOS technology integrated circuits using traditional circuit designs, since CMOS technology is inherently a relatively low power technology, compared, for example, to bipolar circuit technology.

However, personal computers implemented in traditional CMOS circuitry nonetheless still consume enough power to discharge batteries in a period of time short enough to be considered undesirable. One of the sources of this excessive power consumption is the aforementioned PLAs.

FIG. 1 shows a conventional static PLA implemented in CMOS in a Static NOR-NOR configuration with grounded pull-up P type devices to achieve high density. This approach provides the smallest layout area for the PLA in CMOS, and provides excellent performance, but consumes considerably more DC power than a conventional CMOS dynamic PLA implementation, as is known.

Attempts have been made to lower the power consumption requirements of high performance PLAs of this type. For example, U.S. Pat. No. 4,761,769, entitled "MOS Read Only Memory Device," which issued Aug. 2, 1988, and was assigned to Oki Electric Industry Co., Ltd., discloses a PLA having a clock signal generator circuit for generating a pair of positive and negative clock signals by detecting a change in the input signal to the PLA. In response thereto, a charging control circuit arrangement powers up the array. In this way, it is claimed that power consumption is reduced because the PLA is only powered up when needed. However, even this arrangement results in unacceptable power consumption for battery powered computers.

Other references in the general field are U.S. Pat. No. 5,045,726, entitled, "Low Power Programming Circuit For User Programmable Digital Logic Array," which issued Sep. 3, 1991, to North American Phillips Corporation, and which discloses a user programmable PLA comprising a plurality of bipolar transistors arranged in respective rows and columns. Programming current of sufficient magnitude is provided to selected rows and columns to cause a fused connection to be made, thereby characterizing the PLA. The circuit is configured such that row drivers and transmission gates only draw quiescent operating current in operation if the associated link has been previously fused.

U.S. Pat. No. 5,033,017, entitled "Programmable Logic Array With Reduced Power Consumption," which issued on Jul. 16, 1991, and was assigned to Fujitsu Limited and Fujitsu Micro Computer Systems Limited, discloses a PLA having a precharge and discharge arrangement which operates in synchronism with a clock signal supplied thereto. A circuit is provided that holds the programmable logic array in a precharged state by setting the clock signal to a fixed level when the PLA is not selected.

U.S. Pat. No. 4,697,105, entitled "CMOS Programmable Logic Array," which issued on Sep. 29, 1987 and was assigned to the American Telephone and Telegraph Company, AT&T Bell Laboratories, discloses a PLA including a dynamic AND plane and an OR plane using clock load devices. The high precharged voltage state in the AND plane places the logic lines in the OR plane in a low voltage state during precharge. The OR logic lines may then be pulled to a high level during the decode operation. A clock having a delay path is used to control the precharge and decode operations of the PLA.

Finally, U.S. Pat. No. 4,814,646, entitled "Programmable Logic Array Using Emitter-Coupled Logic," which issued on Mar. 21, 1989 and was assigned to Monolithic Memories, Inc., discloses an ECL PLA in which various expedients allegedly produce lower power operation, including the provision of a switched current source pull-down means for pulling down the rows of the PLA array, and by allowing each pair of output terminals to share a predefined set of product terms.

None of the above arrangements provide the desired level of low power operation, combined with high performance operation of the PLA.

SUMMARY OF THE INVENTION

The present invention meets these requirements. In accordance with the present invention there is provided a static logic array implementing a first predetermined logic function, having at least two inputs to which either high or low voltage binary signals can be applied. At least two output signal lines are also provided, the input and output lines being coupled together by way of product term lines. A plurality of pulldown devices connect selected ones of the input and output lines to the product term lines in accordance with the function implemented in the array. The output lines have output line pullup devices associated with them, for pulling the voltage of the output lines positive if no pulldown device connected to it is activated. Also provided are product term pullup devices associated with each of the product term lines, for pulling the voltage of the product term line positive if no pulldown device connected to such product term line is activated. A switch arrangement is provided, associated with each of the product term pullup devices for selectively activating such devices, or alternatively, applying a pulldown signal to the associated product term line. Finally, a decoder is provided, implementing a second predetermined logic function, having its inputs connected to a predetermined subset of at least 2 input lines and having each of its outputs connected to one of the switch arrangements, so as to activate the product term pullup devices associated with the product terms required for operating on the value applied to the input lines, and a minimum number, if any, of other product terms.

Rather than simply switching the entire array on or off, depending upon whether the array is active or inactive, as in prior art approaches, the present invention activates the pullup devices associated with the product terms selectively, based upon a novel decoding and selective activation approach. This provides a significantly greater reduction in the power consumption of the array, when active, than the prior art approaches. In addition, as in the prior art the entire array can be deactivated as well.

Finally, in using the approach of the present invention, the circuit designer may select a desired level of decoding, commensurate with his power reduction requirements and physical layout area available for implementation of the decoder, affording the designer great flexibility.

The foregoing and other objects, features and advantages of the invention will be apparent from the more particular description of the preferred embodiments of the invention, as illustrated in the accompanying drawings and described hereinbelow.

BRIEF DESCRIPTION OF THE DRAWINGS

FIG. 3 is a logic diagram showing a decoder utilized with the array of FIG. 2, in accordance with the principals of the present invention.

FIG. 4 is a circuit diagram of a two input NAND block as used in the decoder of FIG. 3.

FIG. 5 is a circuit diagram of a the selector block used in the decoder of FIG. 3.

FIG. 6 is a circuit diagram of the invertor used in the decoder of FIG. 3.

FIGS. 7-10 are tables of operation of the logic circuits shown in FIGS. 2 and 3.

DETAILED DESCRIPTION OF THE PREFERRED EMBODIMENTS

As described above, the present invention provides great power savings during the operational mode of the static programmed logic array. To illustrate this advantage it is useful to refer to a conventional prior art static logic array, such as that shown in FIG. 1.

Three input lines, X1, X2 and X3 carry the input signals to the array, complementary input signals X1n, X2n, and X3n, respectively, being generated by respective pairs of p type and n type devices connected as invertors to the primary input lines, as shown. A selected plurality of n type devices connected in pulldown mode couple the input lines to four product terms, PT1 through PT4.

Output lines Y1 and Y2 derive their signals through respective pairs of p type and n type devices connected as invertors, from lines 1 and 2, respectively, each having respective pullup devices 3 and 4, and coupled to product term lines PT1-PT4 through a selected arrangement of further n type devices connected as pulldown devices, as shown.

Figure 1:
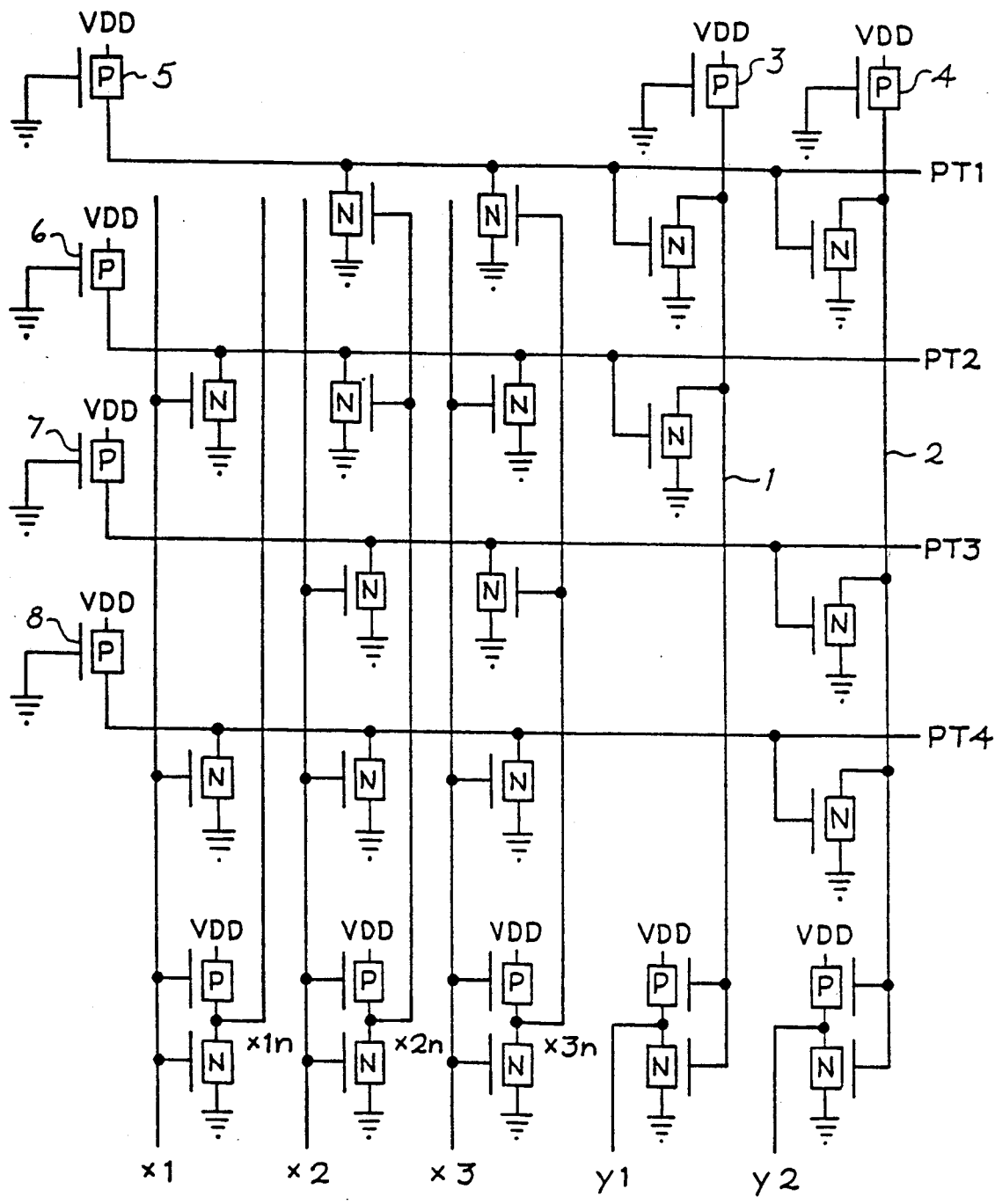
FIG. 1 is a circuit diagram showing a prior art static programmed logic array.

Finally, four p type devices connected as pullup devices 5-8, to respective product term lines PT1-PT4, are provided. Operation of such an array is well known in the art. The array shown in FIG. 1 is implemented in CMOS logic and implements the Boolean function: (y1, y2)=(x2 x3 | x1n x2 x3n, x2 x3 | x2n x3 | x1n x2n x3n).

A significant disadvantage of the array shown in the FIG. 1 is the fact that the pullup devices are always in the on state, resulting in a significant power consumption.

Figure 2:
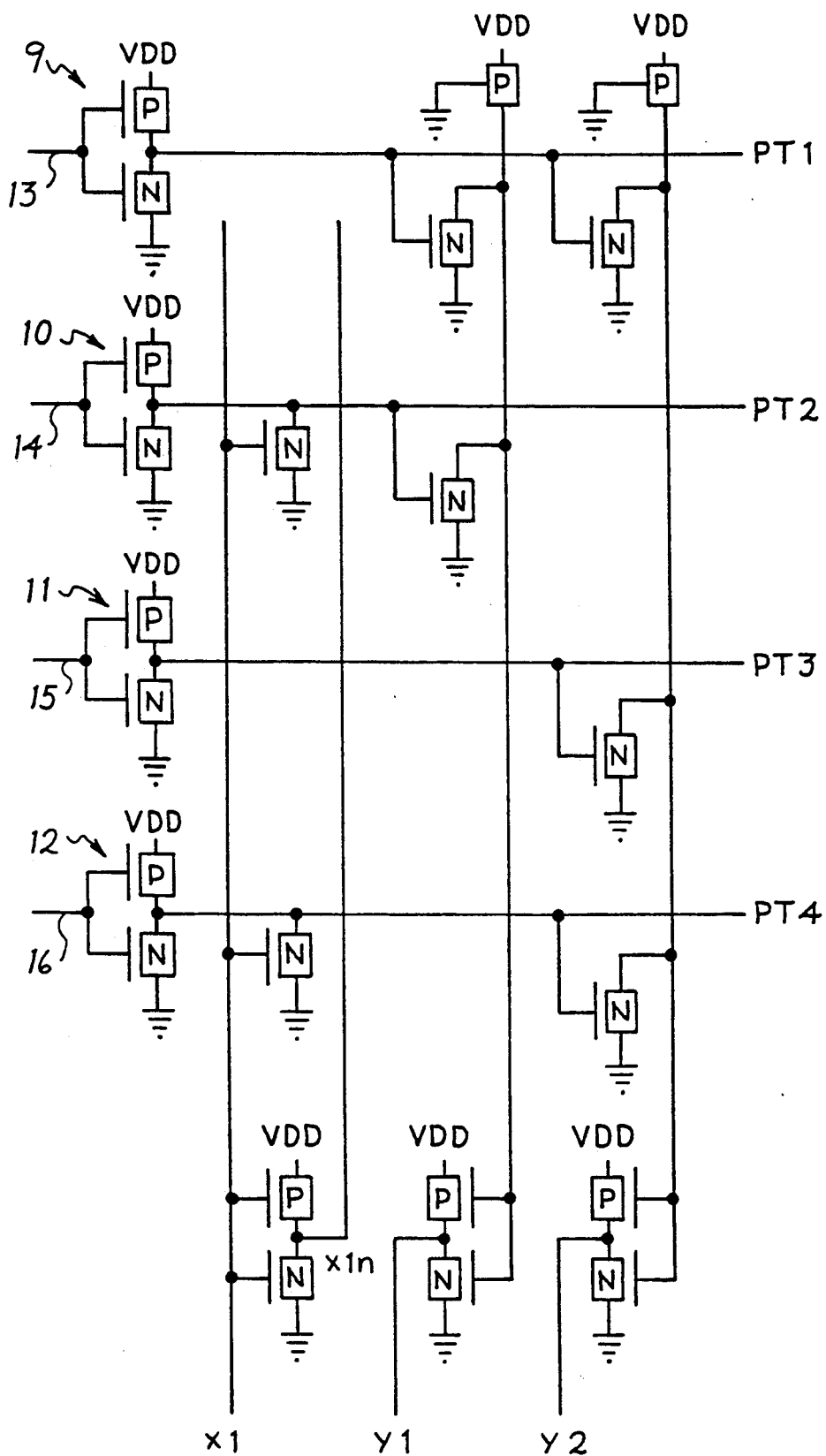
FIG. 2 is a circuit diagram showing a portion of a programmed logic array implemented in accordance with the principals of the present invention.

FIG. 2 is a portion of a programmed logic array, constructed in accordance with the principles of the present invention. When operated in conjunction with the decoder shown in FIG. 3, in the manner described below, it implements the same Boolean function as that implemented in FIG. 1.

Note that the array of FIG. 2 only has the single input, x1, while the decoder of FIG. 3 has inputs x2 and x3. In addition, note that the pullup devices 5–8 of FIG. 1 have been eliminated, and in their place pairs of p type and n type devices 9–12, connected as shown have been provided. These pairs of p type and n type devices, 9–12, connected as invertors, act as power switches for the respective product term lines. By applying a negative voltage to their respective inputs 13–16, the p type device in the pair is activated to provide a pullup function. On the other hand, if a positive voltage is applied to the input 13–16, the p type device of the pair is deactivated and the n type device is activated so as to ground the line, thus causing the line to draw essentially no current.

FIG. 3 shows an n to $3^n$ decoder, representing a preferred embodiment of an aspect of the present invention, in this case a two to nine decoder (n=2). The circuit of FIG. 3 is implemented by an interconnection of two input NAND blocks, the details of which are shown in FIG. 4, selector blocks, the details of which are shown in FIG. 5, and invertors, the details of which are shown in FIG. 6. The decoder of FIG. 3 has as inputs signal lines x2, x3 and S0. Lines x2 and x3 are connected to a selected two of the input lines X1-Xn. The principals of selection are described hereinbelow. Line S0, called the activate line, is utilized to activate or deactive the entire array.

The output lines of the decoder shown in FIG. 3 are labelled DD, TD, CD, etc., as shown. The function by which the output lines are activated in response to the input lines is shown in FIG. 7. In FIG. 7, under x2 and x3, 0 and 1 represent their corresponding input signal states, while a dash represents the "don't care" state. The column labelled SELECT shows which output lines are activated for a given set of inputs. It will be noted, that in general, for any given set of input signals on lines x2 and x3, two or more output lines may be selected. For example, if x2 and x3 have the values 0, then output lines CC, CD, DC and DD will be activated.

FIG. 8 is similar to FIG. 7, except that the effect of input line S0 is added, and the output lines activated are individually displayed as columns, showing more clearly the fact that for a given set of input signals, in general, a plurality of output lines are selected.

The principals of the present invention according to which the output signal lines of the decoder of FIG. 3 are connected to the input lines 13-16 of the power switches of the array of FIG. 2, will now be described In this description, reference will be made to FIG. 9. FIG. 9 expresses the function of the PLA/decoder arrangement of the preferred embodiment of the present invention, shown in FIGS. 2 and 3. As above, a dash represents "don't care". The Boolean expression of the function is set forth next to the table.

Now, it must be determined which outputs of the decoder (FIG. 3) are to be connected to which the inputs to the power switches 13-16 (FIG. 2). This is done by matching each condition of the selected inputs to the decoder (x2 and x3 in this case) with the corresponding product term line of the reduced array of FIG. 2, and connecting the decoder output line associated with that input condition to the corresponding power switch control line for that product term line. For example, referring again to FIG. 7, the first entry shows that for an input condition of "0,0" line CC is selected. To determine which power switch control line(s) to connect this line to, refer to FIG. 9. This shows that when x2,x3 is "0,0", product term line PT4 should be selected, allowing a value of "0" for x1 to produce the indicated output according to the implemented function. Thus, output line CC should be connected to signal line 16. The second entry in FIG. 7 shows that when x2,x3 is "0,1" line CT is selected. Referring again to FIG. 9, this shows that when x2,x3 is "0,1", product term line PT3 should be selected, allowing any x1 input to produce the indicated output according to the implemented function. Thus, output line CT should be connected to signal line 15. And so on.

When this process is complete it will be seen that output line TC should be connected to signal line 14 and output line TT should be connected to signal line 13. No other connections are made from the decoder of FIG. 3 to the array of FIG. 2.

Of course, it will be appreciated that the array used herein for explanation is a simple array, selected as such so as to avoid obscuring the principles of the present invention as implemented in the preferred embodiment. However, once the principles are understood, it will be readily apparent that for larger, more complex arrays, the process of determining the connections between the output lines of the decoder and the numerous power switch control lines, while corresponding more lengthy, is the same. Beyond a certain size array, in general all output lines of the decoder will be connected to at least one power switch control line, and, depending on the size of the array, possibly to several. In the case of a single output line being connected to more than one power switch control, simply connect the output directly to each, i.e., "dot" them together.

Note that the discussion above proceeded on the assumption that inputs x2 and x3 were connected to the inputs of the decoder, and that is the connection shown in FIGS. 2 and 3. However, as a general matter it is desirable to determine which pair of inputs selected for connection to the decoder result in the minimum power consumption.

The method which will now be described proceeds on the assumption that the input selection producing the lowest desired power consumption is the selection that results in the smallest power consumption when the highest power consumption condition exists. A different assumption will require modifying the method. However, once the principles of this aspect of the invention are understood, such modification is well within the scope of ability of one of ordinary skill in this art area.

The first step in the method is to select any two of the input lines to analyze.

Pre-decode = {x2, x3}

In other words, assume that the two array inputs selected for predecode are x2 and x3.

Input pattern (I) = 010

In other words, assume an input pattern, I, to the array of 010.

$PLA[x2, x3] \cap I[x2, x3] = \{PT2\} = P$

In other words, the intersection of the set of product term lines in the array selected by the subset of inputs assumed for predecode and the input pattern selected is the product term line PT2(P).

$I \cap P = \{PT2\}$

In other words, the intersection of the set of product terms selected assuming this set of predecode conditions and the actual product terms involved in implementing the full PLA logic function on the selected input pattern is PT2.

$P - I \cap P = 0$

In other words, the product terms selected using this set of predecode assumptions that are not involved in implementing the logic function of the array for this input pattern consume no power.

$|P - I \cap P| = 0$

In other words the number of "extra" selected product terms is 0.

$PLA[I \cap P; y1, y2] = 10 \text{ (sum} = 1)$

In other words, the number of output lines involved in expressing the output of the PLA function for this assumed input pattern is 1. This determination is done because when an output line is selected, the pulldown device associated with that output line is consuming power, which contributes to the overall consideration of power optimization.

```
  10
  00
  10   (sum = 1)
```

The number of consuming pulldown devices in the AND array is summed with the number of power consuming pulldown devices in the OR array activated for this assumed input pattern, assuming the subset of inputs selected for this predecode calculation.

FIG. 10 shows the results of the above calculation, given the above assumptions, for a complete set of inputs. FIG. 10 shows that the worst case power consumption occurs when the input pattern is 011 or 111, resulting in a worst case power consumption of two, representing involvement of two activated pulldown devices in the array.

The above describes a preferred embodiment of the present invention, involving a two to nine decoder connected to a subset of two input lines. It will be understood that other forms of decode may be readily conceived once the principals of the present invention, as described herein, are understood. For example, an advantageous decode arrangement that provides very good power reduction at a cost of less than doubling the number of devices over the above embodiment is one in which a pair of two to nine decoders are used in parallel, connected to a subset of four input lines.

In addition, higher orders of the n to 3**n decoder may be employed, such as a 3 to 27 decoder, 4 to 81 decoder, and so on. Whether to employ such higher order decoders, or to use some combination of them, depends on factors such as the available area on the semiconductor chip, performance requirements, and the like. The two to nine decoder described above was considered to offer an optimal decrease in power consumption, with a minimal increase in device count and decrease in performance. Other arrangements, and variations in the methods disclosed herein may be used without departing from the spirit and scope of the invention as set forth herein in the following appended claims.

We claim:

1. A low power static logic circuit, comprising:
   a static logic array implementing a first predetermined logic function, having at least two inputs to which either high or low voltage binary value signals can be applied, and having at least two output signal lines, said input and said output lines being coupled by way of a plurality of product term lines, a first plurality of pull down devices connecting selected ones of said input devices to selected ones of said product term lines, a second plurality of pull down devices connecting selected ones of said output lines to selected ones of said product term lines, said array output lines having output line pull up means associated therewith for pulling the voltage of said output lines positive if no pull down device connected to an output line is activated;
   product term pull up means, associated with each of said product term lines, for pulling the voltage of said product term lines positive if no pull down device connected to its associated product term line is activated;
   switch means associated with each of said product term pull up means for selectively activating its associated pull up means, or, alternatively, applying a pull down signal to the associated product term line; and
   a decoder implementing a second predetermined logic function, having its inputs connected to a predetermined subset of said at least two input lines, and having each of its outputs connected to one of said switch means, so as to activate the product term pull up means associated with the product terms involved in the logical function operation of said array on the signals on said array input lines, and also activate one or more, but not all, of the other product terms of said array.

2. A low power static logic circuit, comprising
   a static logic array implementing a first predetermined logic function, having at least two inputs to which either high or low voltage binary value signals can be applied, and having at least two output signal lines, said input and said output lines being coupled by way of a plurality of product term lines, a first plurality of pull down devices connecting selected ones of said input devices to selected ones of said product term lines so as to form an AND array, the inputs of which are said inputs of said array and the outputs of which are said product term lines, a second plurality of pull down devices connecting selected ones of said output lines to selected ones of said product term lines so as to form an OR array, the inputs of which are said product term lines and the outputs of which are said output lines of said array, said array output lines having output line pull up means associated therewith for pulling the voltage of said output lines positive if no pull down device connected to an output line is activated;
   product term pull up means, associated with each of said product term lines, for pulling the voltage of said product term lines positive if no pull down device connected to its associated product term line is activated;
   switch means associated with each of said product term pull up means for selectively activating its associated pull up means, or, alternatively, applying a pull down signal to the associated product term line; and
   a decoder implementing a second predetermined logic function, having its inputs connected to a predetermined subset of said at least two input lines, and having each of its outputs connected to one of said switch means, so as to activate the product term pull up means associated with the product terms involved in the logical function operation of said array on the signals on said array input lines, and also activate one or more, but not all, of the other product terms of said array.

3. A low power static logic circuit according to claim 1 wherein said decoder comprises an n to $3^{**}n$ decoder.

4. A method for making a low power static logic circuit that operates on a set n of input lines, comprising the steps of:
   providing a static logic array having a plurality of input ports and a plurality of output ports, and having a plurality of current sources having control ports by which said current sources can be activated and deactivated, wherein said current sourcing devices operate in conjunction with a plurality of gating devices coupling said input ports and said output ports to implement a first predetermined logic function;
   providing a decoder implementing a second predetermined logic function, having a plurality of input ports smaller in number than the number of input ports of said static logic array, and having a plurality of output ports;
   selecting the input lines to connect to the input ports of said decoder by automatically:
      selecting a first subset of the input lines, and determining the proper connections between the outputs of said decoder and the inputs of said array with said first subset of input lines connected to the input of said decoder and the proper connections for the remaining input lines to the remaining inputs of said array;
      determining a parameter of power consumption of said circuit connected to said input lines and interconnected as recited in the previous step, for a predetermined set of input conditions;
      selecting iteratively all other subsets of the input lines, and for each such subset determining the proper connections between the outputs of said decoder and the inputs of said array with such subset of input lines connected to the input of said decoder and the proper connections for the remaining input lines to the remaining inputs of said array;
      determining, for each of such other subsets, a parameter of power consumption of said circuit connected to said input lines and interconnected as recited in the previous step, for a predetermined set of input conditions;

selecting the subset of input lines that, when connected to the input ports of said decoder, result in the lowest power consumption of said circuit as the input lines to be so connected for said circuit; and coupling the selected input lines to the inputs of said decoder and making the proper connections between the outputs of said decoder and the inputs of said array with said selected input lines connected to the input of said decoder and making the proper connections for the remaining input lines to the remaining inputs of said array.

* * * * *